(12) United States Patent
Chary et al.

(10) Patent No.: US 12,315,801 B2
(45) Date of Patent: May 27, 2025

(54) MICROELECTRONIC DEVICES, AND RELATED ELECTRONIC SYSTEMS AND METHODS

(71) Applicant: Micron Technology, Inc., Boise, ID (US)

(72) Inventors: Indra V. Chary, Boise, ID (US); Shuangqiang Luo, Boise, ID (US); Lifang Xu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 325 days.

(21) Appl. No.: 17/349,158

(22) Filed: Jun. 16, 2021

(65) Prior Publication Data

US 2022/0406712 A1 Dec. 22, 2022

(51) Int. Cl.
*H01L 23/528* (2006.01)
*H01L 23/522* (2006.01)
*H01L 23/535* (2006.01)
*H10B 41/27* (2023.01)
*H10B 41/41* (2023.01)
*H10B 43/27* (2023.01)
*H10B 43/40* (2023.01)

(52) U.S. Cl.
CPC ...... *H01L 23/5283* (2013.01); *H01L 23/5226* (2013.01); *H01L 23/535* (2013.01); *H10B 41/27* (2023.02); *H10B 41/41* (2023.02); *H10B 43/27* (2023.02); *H10B 43/40* (2023.02)

(58) Field of Classification Search
CPC ............. H01L 23/5283; H01L 23/5226; H01L 23/535; H10B 43/40; H10B 41/50; H10B 43/10; H10B 43/50; H10B 41/10
See application file for complete search history.

(56) References Cited

U.S. PATENT DOCUMENTS 9,589,978 B1 3/2017 Yip
9,941,209 B2 4/2018 Tessariol et al.
10,373,970 B2 * 8/2019 Lee ........................ H01L 21/764
(Continued)

FOREIGN PATENT DOCUMENTS

KR 10-2021-0007210 A 1/2021

OTHER PUBLICATIONS

International Search Report for International Application No. PCT/US2022/030304, mailed Sep. 13, 2022, 3 pages.
(Continued)

*Primary Examiner* — Yara B Green
*Assistant Examiner* — Fakeha Sehar
(74) *Attorney, Agent, or Firm* — TraskBritt (57) ABSTRACT

A microelectronic device comprises a stack structure, contact structures, and additional contact structures. The stack structure comprises a vertically alternating sequence of conductive material and insulative material arranged in tiers. The stack structure is divided into blocks each comprising a stadium structure including steps comprising horizontal ends of the tiers. The contact structures are within a horizontal area of the stadium structure and vertically extend through the stack structure. The additional contact structures are on at least some of the steps of the stadium structure and are coupled to the contact structures. Memory devices and electronic devices are also disclosed.

21 Claims, 7 Drawing Sheets

(56) References Cited

U.S. PATENT DOCUMENTS

| | | | |
|---|---|---|---|
| 11,742,288 B2* | 8/2023 | Sung | H01L 23/5226 257/314 |
| 2013/0189492 A1 | 7/2013 | Millward et al. | |
| 2017/0249211 A1* | 8/2017 | Hoei | G06F 3/0688 |
| 2019/0081061 A1* | 3/2019 | Tessariol | H01L 23/5226 |
| 2022/0068957 A1* | 3/2022 | Yeh | H01L 23/5226 |

OTHER PUBLICATIONS

International Written Opinion for International Application No. PCT/US2022/030304, mailed Sep. 13, 2022, 4 pages.

* cited by examiner

MICROELECTRONIC DEVICES, AND RELATED ELECTRONIC SYSTEMS AND METHODS

TECHNICAL FIELD

The disclosure, in various embodiments, relates generally to the field of microelectronic device design and fabrication. More specifically, the disclosure relates to microelectronic devices including contact structures within a horizontal area of a stadium structure, and to related electronic systems and methods.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more deck(s) (e.g., stack structure(s)) including tiers of conductive material and insulative material. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) control logic devices (e.g., string drivers) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the deck(s) of the memory device. The staircase structure includes individual "steps" defining contact regions for the conductive material of the tiers, upon which conductive contact structures can be positioned to provide electrical access to the conductive material. In turn, additional conductive structures (e.g., additional conductive contact structures, conductive routing structures) can be employed to couple the conductive contact structures to the control logic devices. However, the additional conductive structures can occupy valuable horizontal space within the memory device that can limit device performance enhancements and/or size reductions.

DETAILED DESCRIPTION

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as NAND Flash memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

As used herein, the terms "longitudinal," "vertical," "lateral," and "horizontal" are in reference to a major plane of a structure are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes a microelectronic device exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)) at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Figure 1:
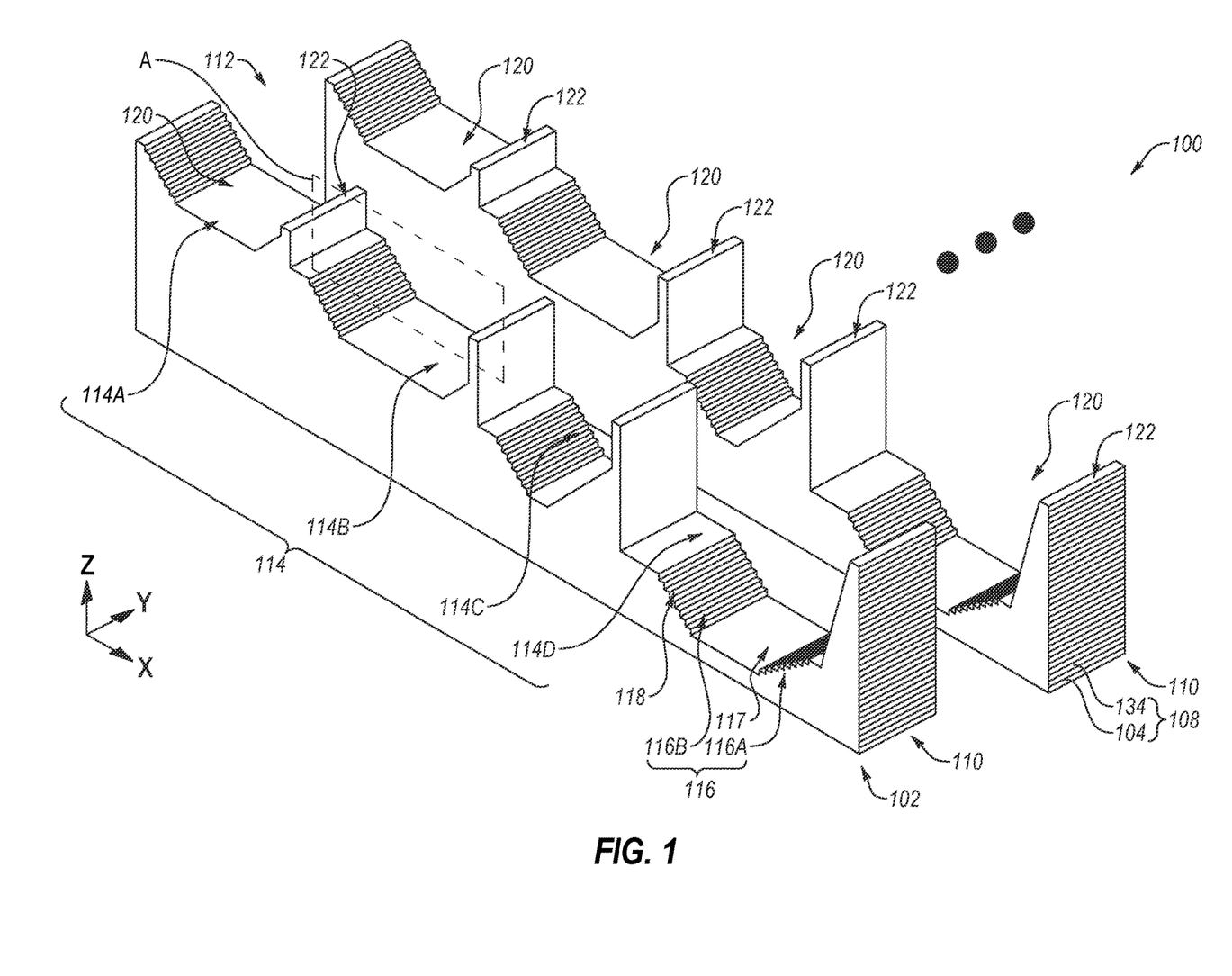
FIG. 1 is simplified, partial perspective view illustrating a microelectronic device structure of a microelectronic device, in accordance with embodiments of the disclosure.

FIG. 1 is simplified, partial perspective view illustrating a microelectronic device structure 100 of a microelectronic device (e.g., a memory device, such as a 3D NAND Flash memory device), in accordance with embodiments of the disclosure. The microelectronic device structure 100 includes a stack structure 102 including conductive material 134 vertically alternating with insulative material 104. As shown in FIG. 1, the stack structure 102 may have tiers 108 each including a level of the conductive material 134 vertically neighboring a level of the insulative material 104. In some embodiments, the insulative material 104 is formed of and includes dielectric oxide material (e.g., $SiO_x$ such as silicon dioxide ($SiO_2$)), and the conductive material 134 is formed of and includes W.

As shown in FIG. 1, the stack structure 102 may be divided into blocks 110 separated by slot structures 142. Each block 110 may include a stadium region made up of multiple stadium structures 114. For example, an individual block 110 may include a first stadium structure 114A, a second stadium structure 114B, a third stadium structure 114C, and a fourth stadium structure 114D. The second stadium structure 114B may be positioned relatively vertically lower (e.g., in the Z-direction) within the block 110 than the first stadium structure 114A; the third stadium structure 114C may be positioned relatively vertically lower within the block 110 than the second stadium structure 114B; and the fourth stadium structure 114D may be positioned relatively vertically lower within the block 110 than the third stadium structure 114C.

Within each block 110 of the stack structure 102, the conductive material 134 of one or more relatively vertically higher tier(s) 108 (e.g., upper tiers) may be employed to form upper select gate structures (e.g., drain side select gate (SGD) structures) for upper select transistors (e.g., drain side select transistors) of the block 110. The conductive material 134 of the relatively vertically higher tier(s) 108 may be segmented by one or more filled slot(s) (e.g., filled SGD slot(s)) to form the upper select gate structures of the block 110. In some embodiments, within each block 110 of the stack structure 102, the conductive material 134 of each of less than or equal to eight (8) relatively higher tier(s) 108 (e.g., from one (1) relatively vertically higher tier 108 to eight (8) relatively vertically higher tiers 108) of the stack structure 102 is employed to form upper select gate structures (e.g., SGD structures) for the block 110. In addition, within each block 110 of the stack structure 102, the conductive material 134 of at least some relatively vertically lower tiers 108 vertically underlying the relatively vertically higher tier(s) 108 may be employed to form access line structures (e.g., word line structures) of the block 110, as also described in further detail below. Moreover, within each block 110 of the stack structure 102, the conductive material 134 of at least a vertically lowest tier 108 may be employed to form as at least one lower select gate structure (e.g., at least one source side select gate (SGS) structure) for lower select transistors (e.g., source side select transistors) of the block 110.

The stadium structures 114 may individually include staircase structures 116 defined by horizontal ends (e.g., edges) of the tiers 108 of the stack structure 102. Each stadium structure 114 may, for example, include a forward staircase structure 116A exhibiting positive slope, a reverse staircase structure 116B exhibiting negative slope, and a central region 117 horizontally interposed between the forward staircase structure 116A and the reverse staircase structure 116B. Each staircase structure 116 may include steps 118 defined by horizontal ends of at least some of the tiers 108. In addition, openings partially defined by the stadium structures 114 may filled with dielectric material so as to form filled trenches 120 (seen in more detail in FIGS. 2A and 2B).

Still referring to FIG. 1, each block 110 of the stack structure 102 further includes crest regions 122 (which may also be referred to as "elevated regions" or "plateau regions") horizontally interposed (e.g., in the X-direction) between horizontally neighboring stadium structures 114. The crest regions 122 may define horizontal boundaries (e.g., in the X-direction and in the Y-direction) of unremoved portions of the tiers 108 of the stack structure 102. As described in further detail below, the crest regions 122 may individual exhibit reduced horizontal dimensions (e.g., in the X-direction) (and, hence, reduced horizontal areas) as compared to the crest regions employed within conventional microelectronic devices. In some embodiments, individual crest regions 122 of individual blocks 110 of the stack structure 102 exhibit a width in the X-direction of less than about 1 micrometer (μm), such as less than or equal to about 500 nanometers (nm), or less than or equal to about 100 nm.

As described in further detail below with reference to FIGS. 2A through 2C, within horizontal areas of the stadium structures 114, individual blocks 110 of the stack structure 102 further include contact structures. For example, within the horizontal area of an individual stadium structure 114, first contact structures may vertically extend through the stack structure 102 and may be coupled to control logic circuitry underlying the stack structure 102; second contact structures may vertically extend through the stack structure 102 and may be electrically isolated from the control logic circuitry; and third contact structures (e.g., word line contact structures) may contact (e.g., physically contact, land on) the conductive material 134 of the tiers 108 of the stack structure 102, and may be coupled to the first contact structures by way of additional conductive structures (e.g., additional contact structures, routing structures). The inclusion of the first contact structures within the horizontal areas of the stadium structures 114 may facilitate reductions in horizontal dimensions (e.g., in the X-direction) of the crest regions 122 of the blocks 110 of the stack structure 102 as compared to conventional configurations including contact structures functionally corresponding to the first contact structures within horizontal areas of the crest regions thereof. As described in further detail below, individual steps 118 of the staircase structures 116 of an individual stadium structure 114 may have a quantity of contact structures (e.g., first contact structures, second contact structures, third contact structures) associated therewith (e.g., at least partially with horizontal boundaries thereof).

Still referring to FIG. 1, within an individual block 110 of the stack structure 102, the first stadium structure 114A may exhibit different contact structures and/or a different arrangement of contact structures within a horizontal area thereof than at least some other of the stadium structures 114 (e.g., the second stadium structure 114B, the third stadium structure 114C, the fourth stadium structure 114D) of the block 110. For example, the first stadium structure 114A may have a reduced number of at least the first contact structures within horizontal boundaries thereof as compared to one or more other of the stadium structures 114. The reduced number of the first contact structures may be associated with the use of the first stadium structure 114A as a so-called SGD stadium, and with the positions of the one or more filled slot(s) (e.g., filled SGD slot(s)) employed to form the upper select gate structures (e.g., SGD structures) of the block 110. At least some of the first contact structures associated with the first stadium structure 114A may instead be positioned within a horizontal area of at least one of the crest regions 122 horizontally neighboring the first stadium structure 114A, which may result these crest region(s) 122 having relatively larger horizontal areas than other crest regions 122 within the block 110. In some embodiments, the first stadium structure 114A is free of first contact structures within the horizontal area thereof. In additional embodiments, the first stadium structure 114A includes some first contact structures within horizontal boundaries thereof.

Figure 2A:
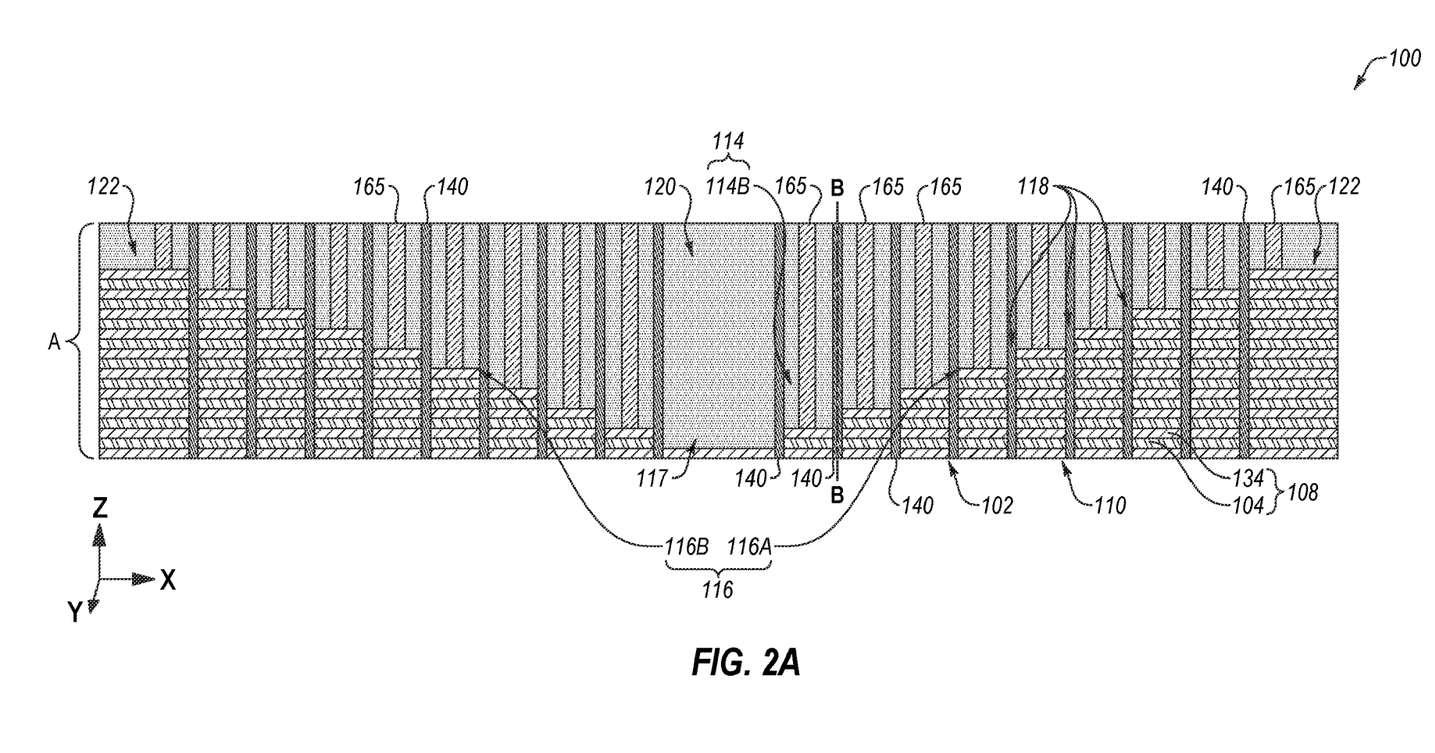
FIG. 2A is a simplified, longitudinal cross-sectional view of a portion A of the microelectronic device structure shown in FIG. 1.

FIG. 2A is a simplified, longitudinal cross-sectional view of portion A (identified with a dashed box in FIG. 1) of the microelectronic device structure 100 depicted in FIG. 1. The portion A encompasses the second stadium structure 114B of an individual block 110 (FIG. 1) of the stack structure 102 (FIG. 1). The portion A also encompasses parts of the crest regions 122 horizontally neighboring the second stadium structure 114B in the X-direction; and the filled trench 120 having boundaries defined by the second stadium structure 114B. While additional features (e.g., structures, materials) of the microelectronic device structure 100 are described hereinbelow with reference to the portion A of the microelectronic device structure 100, such additional features may also be formed and included in additional portions of the microelectronic device structure 100, including additional portions encompassing additional stadium structures 114 of one or more (e.g., each) of the blocks 110 (FIG. 1) of the stack structure 102 (FIG. 1) and parts of the crest regions 122, and the filled trenches 120 having boundaries defined by the additional stadium structures 114. FIG. 2B is a simplified, partial longitudinal cross-sectional view of a portion of the microelectronic device structure 100 of FIGS. 1 and 2A about a dashed line B-B shown in FIG. 2A. FIG. 2C is a simplified, partial plan of the portion A of microelectronic device structure 100 depicted in FIG. 1.

Figure 2B:
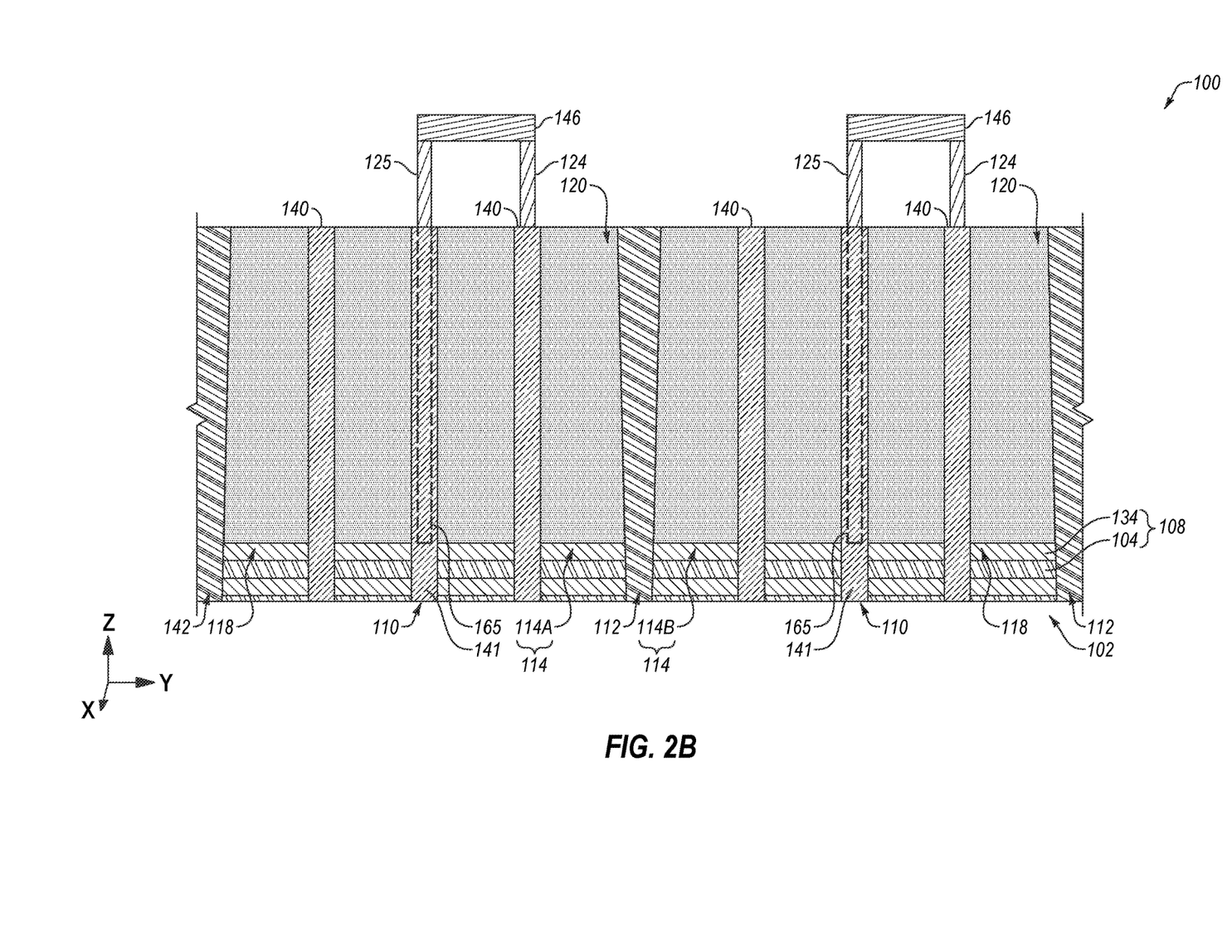
FIG. 2B is a simplified, partial longitudinal cross-sectional view of a portion of the microelectronic device structure shown in FIG. 2A about the dashed line B-B shown in FIG. 2A.
Figure 2C:
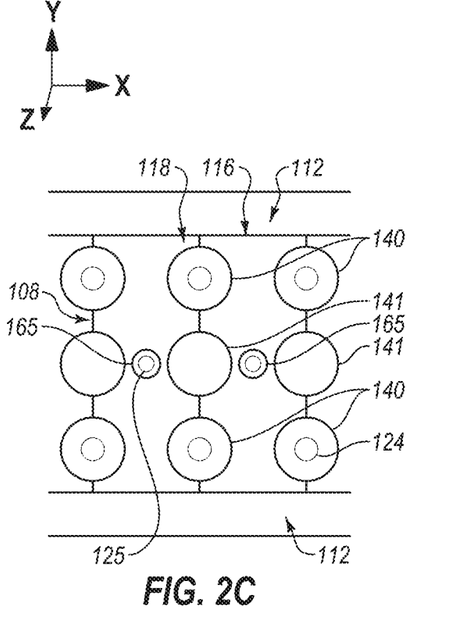
FIG. 2C is a simplified, partial plan view of the portion A of the microelectronic device structure shown in FIG. 1.

Referring collective to FIGS. 2A through 2C, within a horizontal area of the second stadium structure 114B, first contact structures 140 and second contact structures 141 (FIG. 2B) are formed to individually vertically extend through the stack structure 102, and third contact structures 165 are formed to land on the conductive material 134 of the tiers 108 at the steps 118 of the second stadium structure 114B. In addition, as shown in FIG. 2B, the first contact structures 140 may be coupled to the third contact structures 165 (and, hence, the conductive material 134 of the tiers 108) by way of first additional contact structures 124, routing structures 146, and second additional contact structures 125. The first additional contact structures 124 may be positioned on or over the first contact structures 140, the second additional contact structures 125 may be positioned on or over the third contact structures 165, and the routing structures 146 may horizontally extend from and between the first additional contact structures 124 and the second additional contact structures 125. The first contact structures 140 may also be coupled to control logic circuitry (e.g., string driver circuitry) vertically underlying the stack structure 102, as described in further detail below. In some embodiments, within an individual block 110, the first contact structures 140 are positioned relatively more proximate the filled slot structures 112 than the second contact structures 141. The second contact structures 141 are not coupled to the third contact structures 165. In FIG. 2B, the third contact structures 165 are depicted with dashed lines to indicate that the third contact structure 165 are horizontally offset from (e.g., in the X-direction) first contact structures 140 and the second contact structures 141. The first contact structures 140, the second contact structures 141, and the third contact structures 165 vertically extend through the filled trench 120 vertically overlying the second stadium structure 114B.

The first contact structures 140, the second contact structures 141, and the third contact structures 165, the first additional contact structures 124, the second additional contact structures 125, and the routing structures 146 may individually be formed of and include conductive material. In some embodiments, the first contact structures 140, the second contact structures 141, and the third contact structures 165, the first additional contact structures 124, the second additional contact structures 125, and the routing structures 146 are formed of and include one or more of W and $TiN_y$. Dielectric liners (e.g., dielectric oxide liners) may be formed to be horizontally interposed between at least the conductive material 134 of the tiers 108 of the stack structure 102 and the first contact structures 140 and the second contact structures 141 (if any). Each of the dielectric liners may individually have a horizontal thickness with a range of from about 90 nm to about 120 nm, such as about 100 nm.

The first contact structures 140, the second contact structures 141, and the third contact structures 165 may be positioned at desirable locations relative to one another and the steps 118 of the staircase structures 116. Referring to FIG. 2C, in some embodiments, each third contact structure 165 is individually substantially horizontally centrally (e.g., in the X-direction, in the Y-direction) positioned on one of the steps 118 of the staircase structures 116. The first contact structures 140 and the second contact structure 141 may be horizontally offset from the third contact structures 165. An individual step 118 having one of the third contact structures 165 within horizontal boundaries thereof may also exhibit one or more of the first contact structures 140 at least partially within the horizontal boundaries thereof, and, optionally, one or more of the second contact structures 141 at least partially within the horizontal boundaries thereof. In some embodiments, columns individually including one or more (e.g., two or more) of the first contact structures 140 and, optionally, one or more (e.g., one) of the second contact structures 141 horizontally alternate with the third contact structures 165 in the X-direction and horizontally extend in the Y-direction. At least some of the first contact structures 140 within an individual column may be positioned within horizontal boundaries of the same step 118 as one another. Within each column, the first contact structures 140 and the second contact structures 141 (if any) thereof may be substantially aligned with one another in the X-direction. In addition, in some embodiments, rows individually including some (e.g., two or more) of the first contact structures 140 and, optionally, some (e.g., one or more) of the second contact structures 141 may horizontally extend in the Y-direction. Within each row, the first contact structures 140 and the second contact structures 141 (if any) thereof may be substantially aligned with one another in the Y-direction. At least some of the first contact structures 140 within an individual row may be at least partially positioned within horizontal boundaries of different steps 118 than one another.

As shown in FIG. 2C, in some embodiments, within horizontal boundaries of one of the staircase structures 116, one (1) row of the third contact structures 165 is interposed in the Y-direction between two (2) row s of the first contact structures 140; and one (1) row of the second contact structures 141 is also interposed in the Y-direction between the two (2) row s of the first contact structures 140. The one (1) row of the third contact structures 165 may be substantially aligned in the Y-direction with the one (1) row of the second contact structures 141. In addition, in some embodiments, within horizontal boundaries of one of the staircase structures 116, individual third contact structures 165 are interposed in the X-direction between two (2) columns each individually including two (2) first contact structures 140 and one (1) second contact structure 141 between the two (2) first contact structures 140. In additional embodiments, quantities and/or an arrangement the first contact structures 140, the second contact structures 141 (if any), and the third contact structures 165 are different than the quantities and/or the arrangement thereof depicted in FIG. 2C as described in further detail below with reference to FIGS. 3A-3C and FIGS. 4A-4C.

Thus, in accordance with embodiments of the disclosure, a microelectronic device comprises a stack structure, contact structures, and additional contact structures. The stack structure comprises a vertically alternating sequence of conductive material and insulative material arranged in tiers. The stack structure is divided into blocks each comprising a stadium structure including steps comprising horizontal ends of the tiers. The contact structures are within a horizontal area of the stadium structure and vertically extend through the stack structure. The additional contact structures are on at least some of the steps of the stadium structure and are coupled to the contact structures.

Figure 3A:
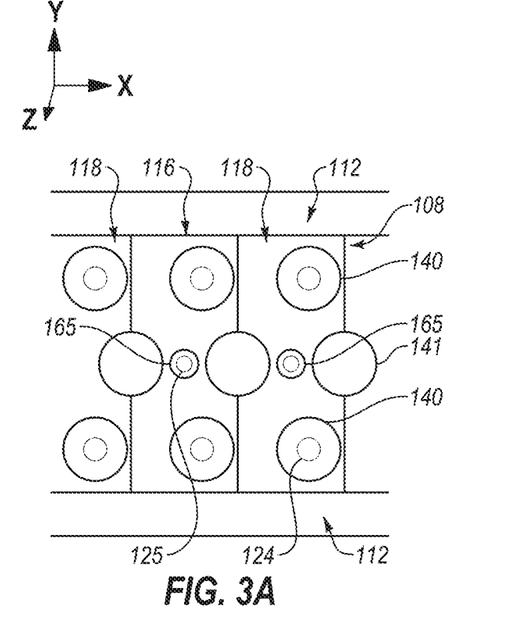
FIGS. 3A, 3B, and 3C are simplified, partial plan views depicting different contact configuration options within the portion A of the microelectronic device structure shown in FIG. 1, in accordance with additional embodiments of the disclosure.

FIG. 3A shows a simplified, partial plan view depicting a different contact configuration within the portion A of the microelectronic device structure 100 shown in FIG. 1, in accordance with additional embodiments of the disclosure. As shown in FIG. 3A the horizontal positions of the first contact structures 140 may be shifted relative to the horizontal positions shown in FIG. 3C. For example, each of the first contact structures 140 may individually be substantially horizontally confined within a horizontal area of one of the steps 118. Each of first contact structures 140 may be horizontally offset in the X-direction from each of the second contact structures 141. Columns individually including some (e.g., two) of the first contact structures 140 may not be collinear with any of the second contact structures 141. The arrangement shown in FIG. 3A may provide for greater separation between the first contact structures 140 and the second contact structures 141. The arrangement may also provide for reduced separation between the first contact structures 140 and the third contact structures 165 relative to the arrangement shown in FIG. 2C. Such reduced separation may reduce a length of the associated routing structures 146 between individual first contact structures 140 and individual third contact structures 165.

Figure 3B:
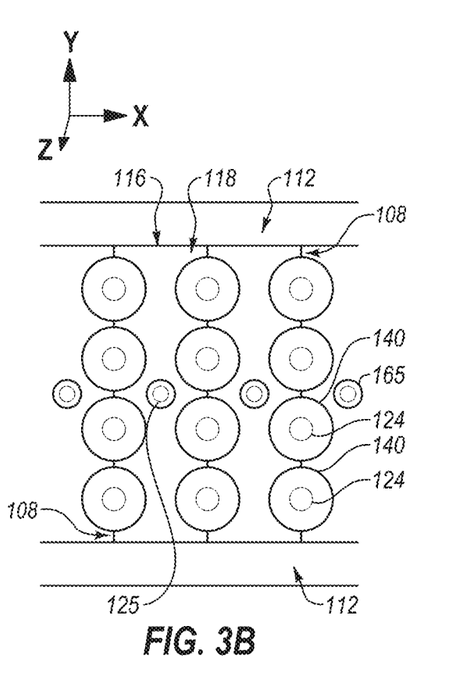

FIG. 3B shows a simplified, partial plan view depicting a different contact configuration within the portion A of the microelectronic device structure 100 shown in FIG. 1, in accordance with additional embodiments of the disclosure. As shown in FIG. 3B, the staircase structure 116 may include first contact structures 140 but may be free of second contact structures 141 (FIG. 2C). Columns of the first contact structures 140 horizontal extending in parallel in the Y-direction may horizontally alternate in the X-direction with the third contact structures 165, and each column may individually include four (4) of the first contact structures 140. In addition, rows of the first contact structures 140 horizontally extending in parallel the X-direction may each be horizontally offset in the Y-direction from a row of the third contact structures 165 horizontally extending in the X-direction. In additional embodiments, each column of the first contact structures 140 includes a different quantity (e.g., less than four, greater than four) of the first contact structures 140 and/or one or more of the first contact structures 140 is replaced with one or more second contact structures 141 (FIG. 2C)

Figure 3C:
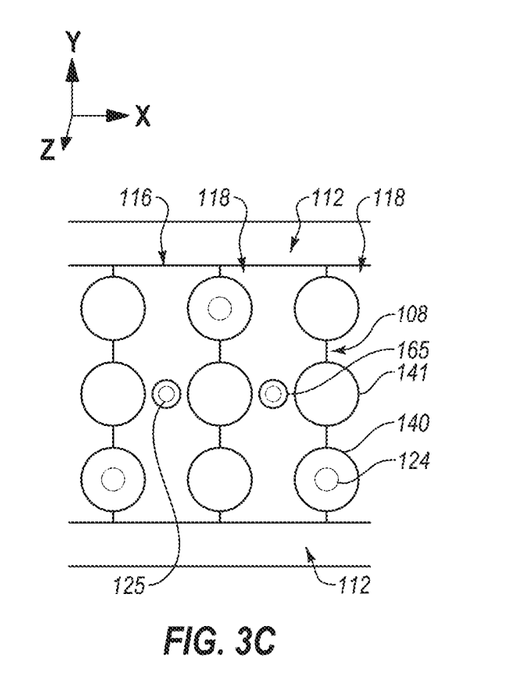

FIG. 3C shows a simplified, partial plan view depicting a different contact configuration within the portion A of the microelectronic device structure 100 shown in FIG. 1, in accordance with additional embodiments of the disclosure. As shown in FIG. 3C, there may be a relatively reduced number of the first contact structures 140 and a relatively increased number of the second contact structures 141 as compared to the configuration previously described with reference to FIG. 2C. In some embodiments, positions of at least some of the first contact structures 140 and second contact structures 141 within horizontally neighboring (e.g., in the X-direct) columns of the first contact structures 140 and the second contact structures 141 are different than one another. For example, horizontally neighboring columns of the first contact structures 140 and the second contact structures 141 may have first contact structures 140 positioned proximate different slot structures 112 (and, hence, different sides of an associated block 110 (FIG. 1)) than one another. At least some rows (e.g., rows proximate the slot structures 112) of the first contact structures 140 and the second contact structures 141 extending in the X-direction may include an alternating sequence of the first contact structures 140 and the second contact structures 141 thereof.

Figure 4A:
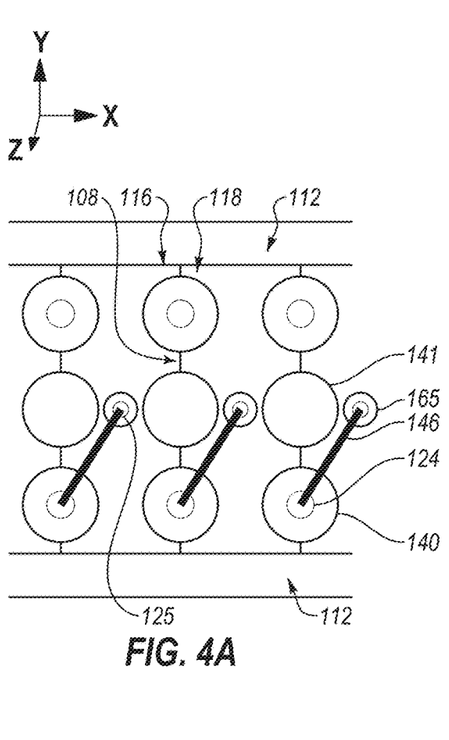
FIGS. 4A, 4B, and 4C are simplified, partial plan views depicting different contact and routing configuration options within the portion A of the microelectronic device structure shown in FIG. 1, in accordance with embodiments of the disclosure.
Figure 4B:
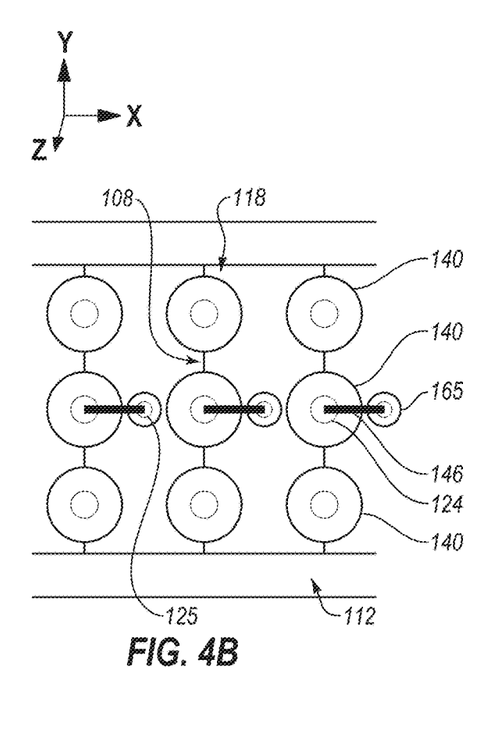
Figure 4C:
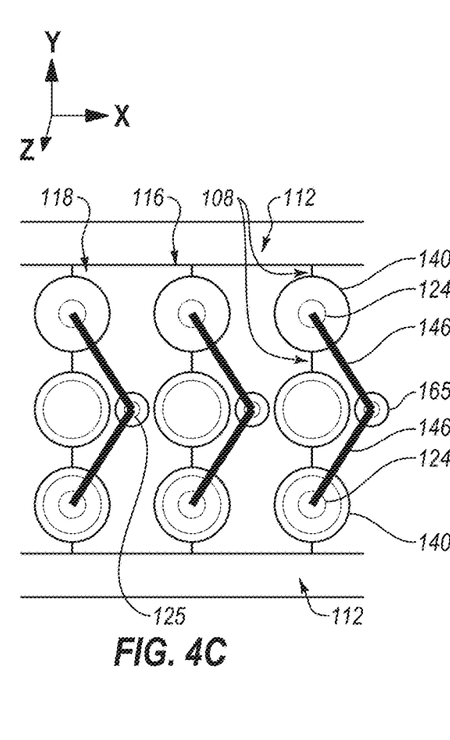

FIGS. 4A, 4B, and 4C are simplified, partial plan views depicting different contact and routing configurations within the portion A of the microelectronic device structure shown in FIG. 1.

Referring to FIG. 4A, in some embodiments, the routing structures 146 are formed to horizontally extend between the third contact structures 165 (and the second additional contact structures 125 associated therewith) and the first contact structures 140 (and the first additional contact structures 124 associated therewith) within a single (e.g., only one) row of the first contact structures 140 positioned proximate one of the slot structures 112 (and, hence, one side of the block 110 (FIG. 1)). Each third contact structure 165 may individually be coupled to one (1) first contact structure 140 by way of an individual routing structure 146 (and an individual first additional contact structure 124 and an individual second additional contact structure 125). The routing structures 146 may each exhibit substantially the same horizontal orientation. For example, each routing structure 146 may exhibit substantially the same diagonal orientation within the XY-plane. In additional embodiments, one or more of the routing structures 146 may be coupled to one or more of the first contact structures 140 within a different row of the first contact structures 140, and/or one or more of the routing structures 146 may exhibit a different horizontal orientation than one or more other of the routing structures 146.

Referring to FIG. 4B, in additional embodiments, the routing structures 146 are formed to horizontally extend between the third contact structures 165 (and the second additional contact structures 125 associated therewith) and the first contact structures 140 (and the first additional contact structures 124 associated therewith) within a single (e.g., only one) row of the first contact structures 140 relatively centrally positioned in the Y-direction within staircase structure 116 (and, hence, within the block 110 (FIG. 1) including the staircase structure 116). Such a configuration may minimize pathing distances of the routing structures 146 to couple the third contact structures 165 to the first contact structures 140. The routing structures 146 may each exhibit substantially the same horizontal orientation. For example, each routing structure 146 may extend in the X-direction between the third contact structures 165 and the first contact structures 140 associated therewith.

Referring to FIG. 4C, in further embodiments, the routing structures 146 are formed to horizontally extend between the third contact structures 165 (and the second additional contact structures 125 associated therewith) and the first contact structures 140 (and the first additional contact structures 124 associated therewith) within multiple (e.g., two) rows of the first contact structures 140 extending in the X-direction. For example, for each third contact structures 165, at least two (2) routing structures 146 may be coupled thereto, the routing structures 146 horizontally extending from the third contact structure 165 to first contact structures 140 within different rows of the first contact structures 140 than one another. In some embodiments, the different rows of the first contact structures 140 are positioned proximate different slot structures 112 (and, hence, proximate different sides of the block 110 (FIG. 1)) than one another. In additional embodiments, one or more of the routing structures 146 may be coupled to one or more of the first contact structures 140 within a different row of the first contact structures 140, such as a relatively centrally positioned row (e.g., in the Y-direction) of the first contact structures 140. Coupling multiple routing structures 146 within an individual third contact structure 165 facilitates redundancy in design. Other variations are envisioned. An individual third contact structure 165 may be electronically connected to a desired quantity of first contact structures 140 through the routing structures 146 (and the first additional contacts structures 124 and the second additional contact structures).

Figure 5:
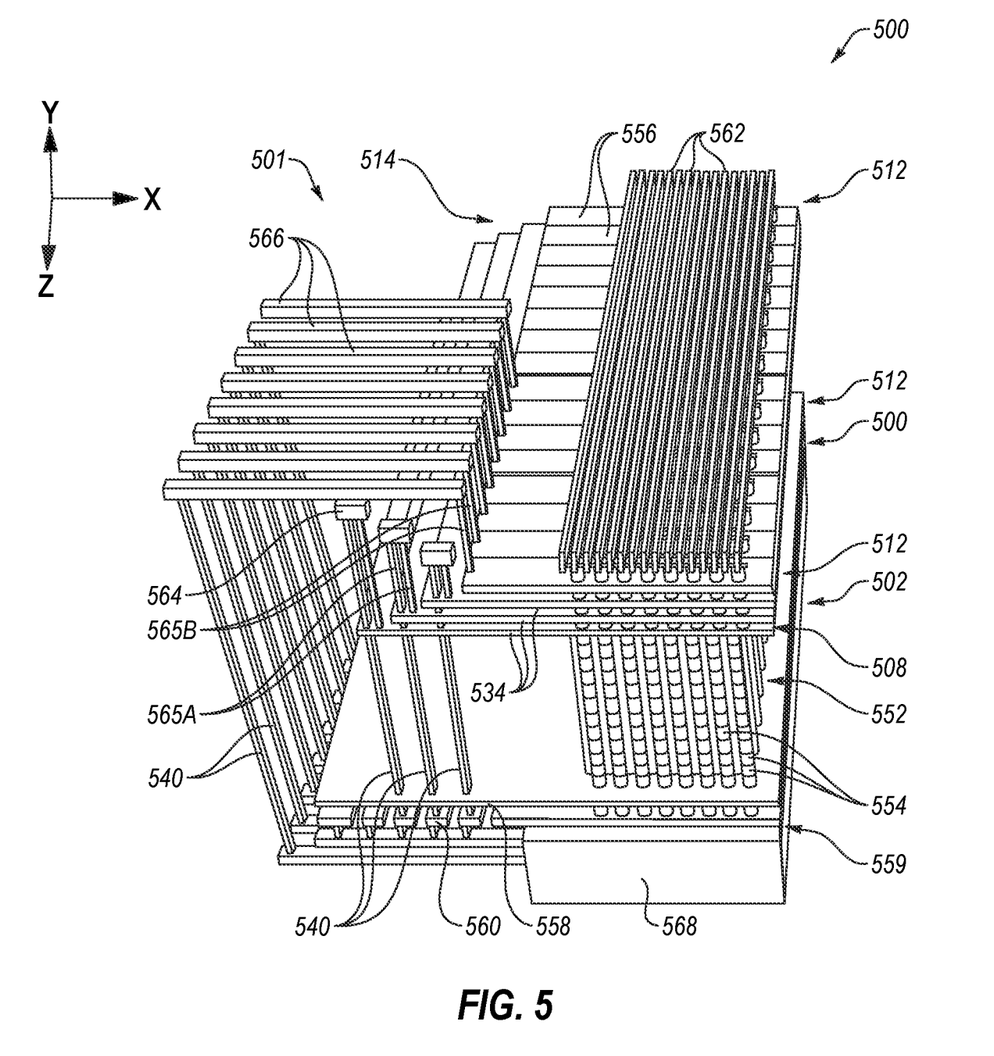
FIG. 5 is a simplified, partial cutaway perspective view of a microelectronic device, in accordance with embodiments of the disclosure.

Microelectronic device structures in accordance with embodiments of the disclosure may be included in microelectronic devices of the disclosure. For example, in accordance with embodiments of the disclosure, FIG. 5 illustrates a partial cutaway perspective view of a portion of a microelectronic device 501 (e.g., a memory device, such as a 3D NAND Flash memory device) including a microelectronic device structure 500. The microelectronic device structure 500 may be substantially similar to one of the microelectronic device structures 100 previously described with reference to FIGS. 1, 2A-2C, 3A-3C, and 4A-4C. For clarity and ease of understanding the drawings and associated description, some features (e.g., structures, materials) of the microelectronic device structures 100 previously described herein are not shown in FIG. 5. However, it will be understood that any features of the microelectronic device structures 100 previously described with reference to one or more of FIGS. 1, 2A-2C, 3A-3C, and 4A-4C may be included in the microelectronic device structure 500 of the microelectronic device 501 described herein with reference to FIG. 5.

As shown in FIG. 5, the microelectronic device structure 500 of the microelectronic device 501 may include first contact structures 540 (corresponding to the first contact structures 140 previous described herein) coupled to third contact structures 565 (corresponding to the third contact structures 165 previously described herein) by way of routing structures 564 (corresponding to the routing structures 146 previously described herein). The first contact structures 540 may positioned within a horizontal area of stadium structures 514 (corresponding to the stadium structures 114 previously described herein) within blocks (corresponding to the blocks 110 previously described herein) of a stack structure 502 (corresponding to the stack structure 102 previously described herein) separated from one another by slot structures 512 (corresponding to the slot structures 112 previously described herein). The first contact structures 540 may vertically extend through the stack structure 502 to conductive structures 560 (e.g., conductive island structures) of a source tier 559 underlying the stack structure 502. The conductive structures 560 may be coupled to a base structure 568 including at least one control logic region having control logic devices configured to control various operations of other features (e.g., strings of memory cells 554) of the microelectronic device 501. The inclusion of first contact structures 540 within the horizontal area of the stadium structures 514 may reduce the number of first contact structures 540 within crest regions (e.g., corresponding to the crest regions 122 previously described herein) between the horizontally neighboring (e.g., in the X-direction) stadium structures 514.

As shown in FIG. 5, in addition to the features of the microelectronic device structure 500 previously described herein in relation to one or more of the microelectronic device structures 100 (FIGS. 1, 2A-2C, 3A-3C, and 4A-4C), the microelectronic device 501 may further include cell pillar structures 552 vertically extending through individual blocks of the stack structure 502. The cell pillar structures 552 may be positioned within regions (e.g., memory array regions) of the blocks horizontally offset (e.g., in the X direction) from the stadium structures 514 within the blocks. Intersections of the cell pillar structures 552 and the conductive material 534 of the tiers 508 of the stack structure 502 form strings of memory cells 554 vertically extending through individual blocks of the stack structure 502. For each string of memory cells 554, the memory cells 554 thereof may be coupled in series with one another. Within an individual block, the conductive material 534 of some of the tiers 508 of the stack structure 502 may serve as access line structures (e.g., word line structures) for the strings of memory cells 554 within the block. In some embodiments, within each block, the memory cells 554 formed at the intersections of the conductive material 534 of some of the tiers 508 and the cell pillar structures 552 comprise so-called "MONOS" (metal-oxide-nitride-oxide-semiconductor) memory cells. In additional embodiments, the memory cells 554 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 554 comprise so-called "floating gate" memory cells including floating gates (e.g., metallic floating gates) as charge storage structures. The floating gates may horizontally intervene between central structures of the cell pillar structures 552 and the conductive material 534 of the different tiers 508 of the stack structure 502.

The microelectronic device 501 may further include first select gates 556 (e.g., upper select gates, drain select gates (SGDs)), select line routing structures 566, one or more second select gates 558 (e.g., lower select gates, source select gate (SGSs)), and digit line structures 562. The digit line structures 562 may vertically overlie and be coupled to the cell pillar structures 552 (and, hence, the strings of memory cells 554). At least one source structure within source tier 559 may vertically underlie and be coupled to the cell pillar structures 552 (and, hence, the strings of memory cells 554). In addition, different third contact structures 565 (e.g., some third contact structures 565A coupled to the conductive material 534 of the tiers 508 and the some of the first contact structures 540; some other third contact structures 565B coupled to the first select gates 556 and the some other of the first contact structures 540) may couple various features of the microelectronic device 501 to one another as shown.

The control logic region of the base structure 568 may include one or more (e.g., each) of charge pumps (e.g., VCCP charge pumps, VNEGWL charge pumps, DVC2 charge pumps), delay-locked loop (DLL) circuitry (e.g., ring oscillators), Vdd regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 568 may be coupled to various conductive structures (e.g., at least some of the conductive structures 560, at least one source structure) of the source tier 559, the routing structures 564, the select line routing structures 566, and the digit line structures 562. In some embodiments, the control logic region of the base structure 568 includes CMOS (complementary metal-oxide-semiconductor) circuitry. In such embodiments, the control logic region of the base structure 568 may be characterized as having a "CMOS under Array" ("CuA") configuration.

Thus, in accordance with embodiments of the disclosure, a memory device comprises a stack structure, first contact structures, second contact structures, routing structures, and strings of memory cells. The stack structure comprises a vertically alternating sequence of conductive material and insulative material arranged in tiers. The stack structure has blocks separated from one another by dielectric slot structures. Each of the blocks comprises stadium structures individually comprising opposing staircase structures each having steps comprising edges of the tiers of the stack structure. The first contact structures are within horizontal boundaries of the opposing staircase structures of at least some of the stadium structures. The first contact structures vertically extend through the stack structure to conductive structures below the stack structure. The second contact structures are on the steps of at least one of the opposing staircase structures of each of the at least some of the stadium structures. The routing structures horizontally extend between and couple the first contact structures to the second contact structures. The strings of memory cells vertically extend through the stack structure and are coupled to the second contact structures.

Figure 6:
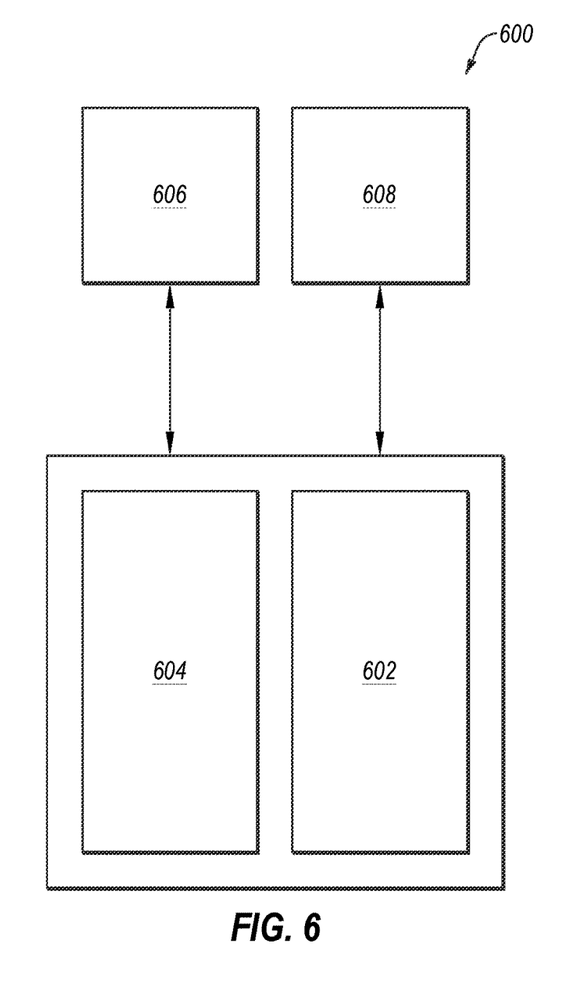
FIG. 6 is a schematic block diagram illustrating an electronic system, in accordance with embodiments of the disclosure.

Microelectronic devices structures (e.g., the microelectronic device structures 100 previously described with reference to FIGS. 1, 2A-2C, 3A-3C, and 4A-4C) and microelectronic devices (e.g., the microelectronic device 501 previously described with reference to FIG. 5) in accordance with embodiments of the disclosure may be used in embodiments of electronic systems of the disclosure. For example, FIG. 6 is a block diagram of an illustrative electronic system 600 according to embodiments of disclosure. The electronic system 600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 600 includes at least one memory device 602. The memory device 602 may comprise, for example, one or more of a microelectronic device structure (e.g., one of the microelectronic device structures 100 previously described with reference to FIGS. 1, 2A-2C, 3A-3C, and 4A-4C) and a microelectronic device (e.g., the microelectronic device 501) previously described herein. The electronic system 600 may further include at least one electronic signal processor device 604 (often referred to as a "microprocessor"). The electronic signal processor device 604 may, optionally, include one or more of a microelectronic device structure (e.g., one of the microelectronic device structures 100 previously described with reference to FIGS. 1, 2A-2C, 3A-3C, and 4A-4C) and a microelectronic device (e.g., the microelectronic device 501) previously described herein. While the memory device 602 and the electronic signal processor device 604 are depicted as two (2) separate devices in FIG. 6, in additional embodiments, a single (e.g., only one) memory/processor device having the functionalities of the memory device 602 and the electronic signal processor device 604 is included in the electronic system 600. In such embodiments, the memory/processor device may include one or more of a microelectronic device structure (e.g., one of the microelectronic device structures 100 previously described with reference to FIGS. 1, 2A-2C, 3A-3C, and 4A-4C) and a microelectronic device (e.g., the microelectronic device 501) previously described herein. The electronic system 600 may further include one or more input devices 606 for inputting information into the electronic system 600 by a user, such as, for example, a mouse or other pointing device, a keyboard, a touchpad, a button, or a control panel. The electronic system 600 may further include one or more output devices 608 for outputting information (e.g., visual or audio output) to a user such as, for example, a monitor, a display, a printer, an audio output jack, a speaker, etc. In some embodiments, the input device 606 and the output device 608 comprise a single touchscreen device that can be used both to input information to the electronic system 600 and to output visual information to a user. The input device 606 and the output device 608 may communicate electrically with one or more of the memory device 602 and the electronic signal processor device 604.

Thus, in accordance with embodiments of the disclosure, an electronic system comprises an input device, an output device, a processor device operably connected to the input device and the output device, and a memory device operably connected to the processor device. The memory device comprises a stack structure, first contact structures, second contact structures, third contact structures, and control logic circuitry. The stack structure comprises a vertically alternating sequence of conductive material and insulative material arranged in tiers. The stack structure comprises stadium structures having steps comprising portions of the conductive material of the tiers. The first contact structures vertically extend through the stack structure and are within horizontal areas of the stadium structures. The second contact structures vertically extend through the stack structure and are within the horizontal areas of the stadium structures. The third contact structures are on the steps of the stadium structures. The third contact structures are in electrical communication with the first contact structures and are electrically isolated from the second contact structures. The control logic circuitry underlies the stack structure and is in electrical communication with the first contact structures.

The structures, devices, and systems of the disclosure advantageously facilitate one or more of improved performance, reduced costs (e.g., manufacturing costs, material costs), increased miniaturization of components, and greater packaging density as compared to conventional structures, conventional devices, and conventional systems. For example, the inclusion of first contact structures (e.g., the first contact structures 140, 540) of the disclosure within horizontal boundaries of the stadium structures (e.g., the stadium structures 114, 514) of the disclosure may reduce number of first contact structures needed within the crest region (e.g., the crest regions 122) interposed between the stadium structures as compared to conventional designs. As a result the crest regions of the disclosure may have reduced horizontal dimensions relative to conventional designs. The relatively reduced sizes of the crest regions of the disclosure may facilitate a relatively greater density of memory cells within a microelectronic device (e.g., the microelectronic device 501) of the disclosure as compared to conventional microelectronic devices, and/or may facilitate relatively reduced dimensions overall for the microelectronic device of the disclosure relative to conventional microelectronic devices. The structures, devices, and systems of the disclosure may also improve scalability, efficiency, and simplicity as compared to conventional structures, conventional devices, and conventional systems.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents. For example, elements and features disclosed in relation to one embodiment may be combined with elements and features disclosed in relation to other embodiments of the disclosure.

What is claimed is:

1. A microelectronic device, comprising:
    a stack structure comprising a vertically alternating sequence of conductive material and insulative material arranged in tiers, the stack structure divided into blocks by a slot structure, each of the blocks comprising a stadium structure including steps defined by edges of the tiers;
    contact structures within the stadium structure and vertically extending through the stack structure;
    additional contact structures on at least some of the steps of the stadium structure and coupled to the contact structures; and
    further contact structures within of the stadium structure and vertically extending through the stack structure, the further contact structures horizontally positioned relatively more distal from the slot structure than are the contact structure, the further contact structures offset from the additional contact structures in a first horizontal direction and substantially aligned with the additional contact structures in a second horizontal direction orthogonal to the first horizontal direction.

2. The microelectronic device of claim 1, further comprising strings of memory cells vertically extending through the stack structure and coupled to the conductive material of the tiers of the stack structure.

3. The microelectronic device of claim 1, wherein the further contact structures are electrically isolated from the additional contact structures.

4. The microelectronic device of claim 1, wherein each of the blocks of the stack structure further comprises a crest region horizontally neighboring the stadium structure and having a horizontal width less than about 1 micrometer.

5. The microelectronic device of claim 4, wherein the horizontal width of the crest region is less than or equal to about 100 nanometers.

6. The microelectronic device of claim 1, wherein:
    the additional contact structures are substantially horizontally centered on the at least some of the steps of the stadium structure; and
    the contact structures are at least partially positioned within the at least some of the steps of the stadium structure.

7. The microelectronic device of claim 1, wherein the further contact structures are at least partially positioned within horizontal areas of the at least some of the steps of the stadium structure, the further contact structures electrically isolated from the additional contact structures.

8. The microelectronic device of claim 6, wherein more than one of the contact structures are at least partially positioned within each of the at least some of the steps of the stadium structure.

9. The microelectronic device of claim 1, wherein each of the additional contact structures has one of the contact structures coupled thereto.

10. The microelectronic device of claim 1, wherein each of the additional contact structures has at least two of the contact structures coupled thereto.

11. The microelectronic device of claim 1, further comprising:
    first contact structures on the contact structures;

second contact structures on the additional contact structures; and routing structures horizontally extending from and between the first contact structures and the second contact structures.

12. The microelectronic device of claim 1, wherein at least one row of the contact structures and at least one row of the additional contact structures each extend in the first horizontal direction, and the at least one row of the contact structures is offset from the at least one row of the additional contact structures in & the second horizontal direction.

13. The microelectronic device of claim 1, wherein at least one row of the contact structures and at least one row of the additional contact structures each extend in the first horizontal direction, and the at least one row of the contact structures is substantially aligned with the at least one row of the additional contact structures in the second horizontal direction.

14. A memory device, comprising:
a stack structure comprising a vertically alternating sequence of conductive material and insulative material arranged in tiers, the stack structure having blocks separated from one another by dielectric slot structures, each of the blocks comprising stadium structures individually comprising opposing staircase structures each having steps defined by edges of the tiers of the stack structure;
first contact structures within the stadium structures and vertically extending through the stack structure;
second contact structures on the steps of at least one of the opposing staircase structures;
third contact structures within the stadium structures and vertically extending through the stack structure, the first contact structures positioned relatively more proximate to the dielectric slot structures than are the third contact structures, the third contact structures offset from the second contact structures in a first horizontal direction and substantially aligned with the second contact structures in a second horizontal direction orthogonal to the first horizontal direction;
routing structures horizontally extending between and coupling the first contact structures to the second contact structures; and
strings of memory cells vertically extending through the stack structure and coupled to the second contact structure.

15. The memory device of claim 14, wherein the third contact structures are electrically isolated from the second contact structures.

16. The memory device of claim 14, further comprising control logic circuitry under the stack structure.

17. The memory device of claim 16, wherein the control logic circuitry comprises complementary-metal-oxide-semiconductor (CMOS) circuitry.

18. The memory device of claim 14, wherein each of the blocks further comprises crest regions horizontally interposed between the stadium structures thereof in the first horizontal direction, each of the crest regions having a horizontal width in the first horizontal direction less than or equal to about 100 nanometers.

19. An electronic device comprising:
an input device;
an output device;
a processor device operably connected to the input device and the output device; and
a memory device operably connected to the processor device and comprising:
a stack structure comprising a vertically alternating sequence of conductive material and insulative material arranged in tiers, the stack structure divided into blocks by a slot structure and comprising stadium structures having steps comprising portions of the conductive material of the tiers;
first contact structures within the stadium structures and vertically extending through the stack structure;
second contact structures vertically extending through the stack structure and within horizontal areas of the stadium structures, the second contact structures horizontally positioned relatively more distal from the slot structure than are the first contact structures, the second contact structures offset from the first contact structures in a first horizontal direction and substantially aligned with the first contact structures in a second horizontal direction orthogonal to the first horizontal direction;
third contact structures on the steps of the stadium structures, the third contact structures in electrical communication with the first contact structures and electrically isolated from the second contact structures; and
control logic circuitry underlying the stack structure and in electrical communication with the first contact structures.

20. The electronic device of claim 19, further comprising routing structures overlying the first contact structures and the third contact structures, each of the routing structures extending between and electrically connecting one of the first contact structures and one of the third contact structures.

21. The electronic device of claim 19, further comprising strings of memory cells vertically extending through the stack structure and coupled to the conductive material of the tiers of the stack structure.

* * * * *

UNITED STATES PATENT AND TRADEMARK OFFICE
CERTIFICATE OF CORRECTION

| | |
|---|---|
| PATENT NO. | : 12,315,801 B2 |
| APPLICATION NO. | : 17/349158 |
| DATED | : May 27, 2025 |
| INVENTOR(S) | : Indra V. Chary, Shuangqiang Luo and Lifang Xu |

Page 1 of 1

It is certified that error appears in the above-identified patent and that said Letters Patent is hereby corrected as shown below:

In the Specification

| | | |
|---|---|---|
| Column 5, | Line 7, | change "nitride ($SiN_y$)) at least" to --nitride ($SiN_y$)), at least-- |
| Column 10, | Line 44, | change "(FIG. 2C)" to --(FIG. 2C).-- |

In the Claims

| | | | |
|---|---|---|---|
| Claim 1, | Column 16, | Line 20, | change "within of the stadium" to --within the stadium-- |
| Claim 12, | Column 17, | Line 11, | change "structures in & the second" to --structures in the second-- |

Signed and Sealed this
Fifth Day of August, 2025

Coke Morgan Stewart
*Acting Director of the United States Patent and Trademark Office*